United States Patent
Nelson

(10) Patent No.: US 9,017,568 B2
(45) Date of Patent: Apr. 28, 2015

(54) PROCESS FOR INCREASING THE HYDROPHILICITY OF SILICON SURFACES FOLLOWING HF TREATMENT

(71) Applicant: TEL FSI, Inc., Chaska, MN (US)

(72) Inventor: Steven L. Nelson, Minnetonka, MN (US)

(73) Assignee: TEL FSI, Inc., Chaska, MN (US)

( * ) Notice: Subject to any disclaimer, the term of this patent is extended or adjusted under 35 U.S.C. 154(b) by 0 days.

(21) Appl. No.: 14/159,560

(22) Filed: Jan. 21, 2014

(65) Prior Publication Data

US 2014/0206200 A1    Jul. 24, 2014

Related U.S. Application Data

(60) Provisional application No. 61/755,327, filed on Jan. 22, 2013.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *C25F 3/00* | (2006.01) |
| *H01L 21/306* | (2006.01) |
| *H01L 31/18* | (2006.01) |

(52) U.S. Cl.
CPC .............. *H01L 21/306* (2013.01); *H01L 31/18* (2013.01)

(58) Field of Classification Search
USPC ........................................ 438/745; 134/3, 1.3
See application file for complete search history.

(56) References Cited

U.S. PATENT DOCUMENTS

| | | |
|---|---|---|
| 6,087,273 A | 7/2000 | Torek et al. |
| 6,123,865 A | 9/2000 | Lin et al. |
| 6,406,551 B1 | 6/2002 | Nelson et al. |
| 6,488,272 B1 | 12/2002 | Nguyen |
| 6,835,667 B2 | 12/2004 | Christenson et al. |
| 7,592,264 B2 | 9/2009 | Christenson et al. |
| 7,819,984 B2 | 10/2010 | DeKraker et al. |
| 2004/0261817 A1 | 12/2004 | Araki et al. |
| 2005/0205115 A1 | 9/2005 | Okuyama et al. |
| 2007/0087456 A1 | 4/2007 | Hashizume |
| 2007/0245954 A1 | 10/2007 | Collins et al. |

(Continued)

OTHER PUBLICATIONS

A.L.P. Rotondaro et al., "Use of H2S04 for Etch Rate and Selectivity Control of Boiling H3P04," Electrochemical Society Proceedings vol. 99-36,p. 385-390 (1999).

(Continued)

*Primary Examiner* — Roberts Culbert
(74) *Attorney, Agent, or Firm* — Kagan Binder, PLLC

(57) ABSTRACT

A method for performing an oxide removal process is described. The method includes providing a substrate having an oxide layer, and preparing a patterned mask layer on the oxide layer, wherein the patterned mask layer has a pattern exposing at least a portion of the oxide layer. An HF treatment of the substrate is performed to transfer the pattern at least partially through the oxide layer, wherein the HF treatment exposes a silicon surface. Following the performing of the HF treatment, a surface property of the silicon surface is modified, wherein the modifying includes administering at least one oxidizing agent to contact the silicon surface to cause chemical oxidation of the silicon surface. And, following the modifying of the surface property, at least a portion of the patterned mask layer or a residual portion of the patterned mask layer is removed.

20 Claims, 1 Drawing Sheet

(56) References Cited

U.S. PATENT DOCUMENTS

| | | |
|---|---|---|
| 2008/0008834 A1 | 1/2008 | Collins et al. |
| 2009/0056744 A1* | 3/2009 | Carswell ........................ 134/1.3 |
| 2009/0280235 A1 | 11/2009 | Lauerhaas et al. |
| 2010/0018951 A1* | 1/2010 | Christenson et al. ........... 216/92 |
| 2012/0145672 A1 | 6/2012 | Ratkovich et al. |

OTHER PUBLICATIONS

Christenson et al., "Effects of SC-1 Dilution and Temperature Variations on Etch Rate and Surface Haze," Mat. Res. Soc. Symp. Proc. vol. 386, 1995 Materials Research Society, 135-141.

Christenson et al., "Effects of SC-1 dilution and Temperature on Various Particle Removal Challenges," Electrochemical Society Proceedings vol. 95-20, 597-604.

Gale et al., "State-of-the-Art Drying Methods for Semiconductor Wet Benches," Electrochemical Society Proceedings vol. 97-35, 31-37.

Kim et al., "Evaluation of Wafer Drying Methods for GIGA-LEVEL Device Fabrication," Solid State Phenomena vols. 103-104 (2005) pp. 67-70.

Knotter et al., "Silicon Surface Roughening Mechanisms in Ammonia Hydrogen Peroxide Mixtures," Journal of the Electrochemical Society, 147 (2) 736-740 (2000).

Miya et al., "Effective Rinse Aiming at Water-Mark-free Drying for Single-spin Wet Cleaning Process," Solid State Phenomena vols. 103-104 (2005) pp. 79-82.

Namba et al., "Insights into Watermark Formation and Control," Solid State Phenomena vols. 103-104 (2005) pp. 83-86.

Resnick et al., "A Study of Cleaning Performance and Mechanisms in Dilute SC-1 Processing," Mat. Res. Soc. Symp. Proc. vol. 386, 1995 Materials Research Society, 21-26.

Van den Meerakker et al., "A Mechanistic Study of Silicon Etching in $NH_3/H_2O_2$ Cleaning Solutions," J. Electrochem. Soc., vol. 137, No. 4, Apr. 1990, 1239-1243.

Verhaverbeke et al., "The Role of $HO_2$ in SC-1 Cleaning Solutions," Mat. Res. Soc. Symp. Proc. vol. 477 1997 Materials Research Society, 47-56.

Verhaverbeke et al., "A Quantitative Model of SC-1 Wet Processing," Proceedings of the Third International Symposium on Ultra Clean Processing of Silicon Surfaces, 153-156.

\* cited by examiner

US 9,017,568 B2

PROCESS FOR INCREASING THE HYDROPHILICITY OF SILICON SURFACES FOLLOWING HF TREATMENT

CROSS-REFERENCE TO RELATED APPLICATIONS

Pursuant to 37 CFR §1.78(a)(4), this application claims the benefit of and priority to U.S. Provisional Application Ser. No. 61/755,327, filed on Jan. 22, 2013, the entire content of which is herein incorporated by reference.

FIELD OF THE INVENTION

The invention relates to a method for cleaning a substrate, and in particular, a method for cleaning a substrate while reducing particle contamination.

BACKGROUND OF THE INVENTION

In oxide removal processes, such as HF treatment for patterning oxide layers in dual gate oxide integration, silicon surfaces exposed by the HF treatment are rendered hydrophobic and made more prone to particle contamination. This observation may, in part, be evidenced by the lack of substrate wetting coverage, when for example, rinsing with aqueous media in the subsequent ViPR™ resist removal step that may be performed using the ORION® single wafer processing tool commercially available from TEL FSI, Inc. (Chaska, Minn.). Additional details for resist removal using point-of-use mixing of steam (water vapor) and SPM (sulfuric acid-hydrogen peroxide mixture), such as the ViPR™ process, are provided in U.S. Patent Application Publication No. 2010/0018951, entitled "Process for removing material from substrates", the content of which is incorporated herein by reference in its entirety.

In a conventional process, an oxide layer is patterned by exposing the oxide layer to an HF solution through a patterned mask layer, such as a layer of photoresist having a pattern formed therein using a lithographic process. Thereafter, the patterned mask layer is removed by exposure to SPM (sulfuric acid-hydrogen peroxide mixture), such as a ViPR™ process, followed by exposure to a cleaning process for removing particles that includes exposure to an aqueous solution of ammonium hydroxide and hydrogen peroxide. Following the HF treatment, some exposed surfaces on the substrate may be made hydrophobic, and thus, be prone to particle contamination. And, such particle contamination may be exacerbated when the substrate fails to be continuously wetted from the HF treatment step through the patterned mask layer removal step.

SUMMARY OF THE INVENTION

The invention relates to a method for cleaning a substrate. In particular, the invention relates to a method for cleaning a substrate by inserting a process step to modify substrate surfaces prone to particle contamination. The process step includes oxidizing these surfaces, which may be performed at least in part during the HF treatment, following the HF treatment, preceding removal of the patterned mask layer, and during the removal of the patterned mask layer. At least a portion of the oxidizing occurs following the HF treatment and preceding the removal of the patterned mask layer.

BRIEF DESCRIPTION OF THE DRAWINGS

In the accompanying drawings.

DETAILED DESCRIPTION OF EXEMPLARY EMBODIMENTS

Figure 1A:
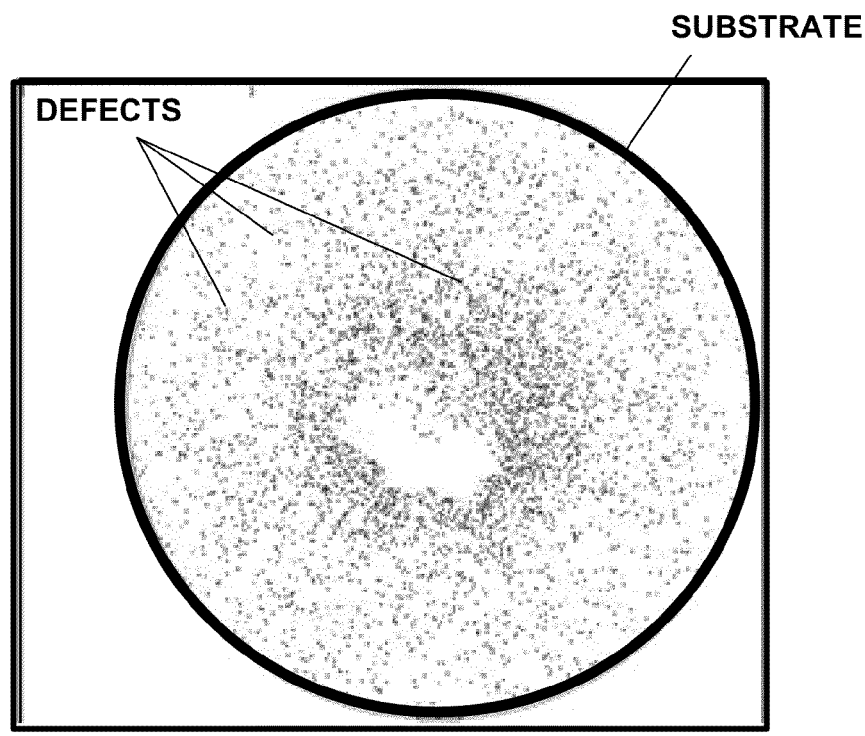
FIG. 1A illustrates a particle map for the process condition when no oxidation step is inserted between the HF treatment step and the patterned mask layer removal step.

A method for cleaning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

A method for performing an oxide removal process is described. The method includes: providing a substrate having an oxide layer; preparing a patterned mask layer on the oxide layer, the patterned mask layer comprising a pattern exposing at least a portion of the oxide layer; performing an HF treatment of the masked substrate to pattern at least a portion of the oxide layer, the HF treatment exposing a silicon surface; following performing the HF treatment, modifying a surface property of the silicon surface to mitigate side effects of the HF treatment, the modifying including administering a surface reaction at the silicon surface to increase a hydrophilicity of the silicon surface by dispensing an oxidizing solution onto the silicon surface to cause chemical oxidation of the silicon surface; and following the modifying the surface property, removing at least a portion of the patterned mask layer or a residual portion of the patterned mask layer. Silicon surfaces on the substrate are more hydrophilic, and thus, more effectively treated by subsequent treatments involving aqueous media, e.g., SPM (Sulfuric Peroxide Mixture), APM (Ammonium Peroxide Mixture), BOE (Buffered Oxide Etch), ViPR™, etc.

The oxidizing solution may include a peroxide, such as hydrogen peroxide, or other oxidizing media, e.g., ozone or aqueous ozone. The oxidizing solution may be introduced together with an aqueous base, such as aqueous ammonium hydroxide, or tetramethylammonium hydroxide (TMAH), or a combination thereof.

In a preliminary test, the surface condition of a substrate following various exposures was qualitatively assessed by placing a droplet of water on the treated surface and observing the droplet contact angle with the substrate surface.

In Process condition A, the substrate was exposed to HF (100:1 by volume; 100 parts water to 1 part 49 w/v % aqueous HF solution) for 89 seconds; followed by exposure to $H_2O_2$ (4:1 by volume; 4 parts water to 1 part 30 w/v % hydrogen peroxide solution) for 20 seconds. The surface was observed to be hydrophobic.

In Process condition B, the substrate was exposed to HF (100:1 by volume) for 89 seconds; followed by exposure to $H_2O_2$ (4:1 by volume) for 60 seconds. The surface was observed to be hydrophobic.

In Process condition C, the substrate was exposed to HF (100:1 by volume) for 89 seconds; followed by exposure to SC1-RT (room temperature) (1:50:200 by volume ($NH_4OH$/

$H_2O_2/H_2O$); 1 part ammonia, 50 parts hydrogen peroxide, 200 parts water) for 60 seconds. The surface was observed to be hydrophilic.

In Process condition D, the substrate was exposed to HF (100:1) for 89 seconds; followed by exposure to SC1-RT (room temperature) (1:50:200 by volume ($NH_4OH/H_2O_2/H_2O$)) for 20 seconds. The surface was observed to be hydrophilic.

As a result, an oxidizing step (e.g., 20 sec, 1:50:200 by volume SC1-RT) was inserted between an HF treatment process step and a patterned mask layer removal step to modify the surface property of exposed silicon surfaces and reduce particle contamination.

In a first test, a substrate having a blanket oxide layer is subjected to a standard process sequence that includes: (1) HF treatment; (2) followed by ViPR™ treatment (stripping process with aqueous SPM and steam); and (3) followed by SC1 treatment (aqueous cleaning process with $H_2O_2$ and $NH_4OH$). FIG. 1A provides a particle map showing the added particles as a result of the process sequence, including the particle size distribution.

Figure 1B:
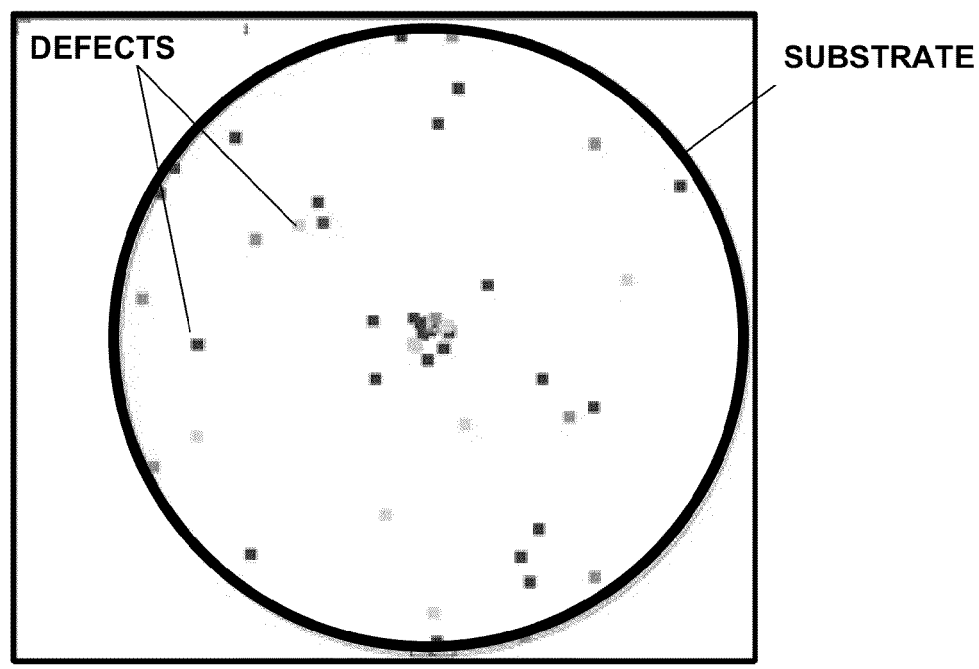
FIG. 1B illustrates a particle map for the process condition when an oxidation step is inserted between the HF treatment step and the patterned mask layer removal step.

In a second test, a substrate having a blanket oxide layer is subjected to a new process sequence that includes: (1) HF treatment; (2) followed by oxidation treatment using SC1-RT (1:50:200 by volume ($NH_4OH/H_2O_2/H_2O$)) for 20 seconds; (3) followed by ViPR treatment (stripping process with aqueous SPM and steam); and (4) followed by SC1 treatment (aqueous cleaning process with $H_2O_2$ and $NH_4OH$). FIG. 1B provides a particle map showing the added particles as a result of the process sequence, including the particle size distribution. The data shows how the oxidizing treatment significantly reduces particle contamination at least in part by making aqueous treatments, such as ViPR™, SPM, SC1, etc., more effective when using an HF treatment in photoresist patterning and removal processes.

A commercially available surface defect counter was used for these measurements. The equipment is designed and made by KLA-Tencor, model SP2. It places the substrate in a dark environment then shines a laser at a spot on the wafer surface. The laser scans the entire surface. If the surface location illuminated by the laser has no defect then all the light is reflected by the surface. If the surface location illuminated by the laser has a small defect then some of the laser light is scattered in many directions. Mirrors and other optic components pickup this scattered light and measure it to determine the size and location of the defects. A map is generated to show the location of the defects and a table is generated to show the number of defects at different sizes. The surface is scanned before running the process and again after running the process. The tools software automatically calculates and shows how many defects were added by the process in the main map, how many defects were removed by the lower left map and how many defects were unchanged by the lower right map.

The invention claimed is:

1. A method for performing an oxide removal process, comprising:
   providing a substrate having an oxide layer;
   preparing a patterned mask layer on said oxide layer, said patterned mask layer comprising a pattern exposing at least a portion of said oxide layer;
   performing an HF treatment of said substrate to transfer said pattern at least partially through said oxide layer, said HF treatment exposing a silicon surface;
   following said performing said HF treatment, modifying a surface property of said silicon surface, said modifying including administering at least one oxidizing agent to contact said silicon surface to cause chemical oxidation of said silicon surface; and
   following said modifying said surface property, removing at least a portion of said patterned mask layer or a residual portion of said patterned mask layer.

2. The method of claim 1, wherein said oxide layer comprises a thermally grown silicon dioxide layer.

3. The method of claim 1, wherein said oxidizing agent comprises a peroxide.

4. The method of claim 1, wherein said oxidizing agent comprises hydrogen peroxide.

5. The method of claim 4, wherein said oxidizing agent further comprises an aqueous base.

6. The method of claim 5, wherein said aqueous base comprises aqueous ammonium hydroxide, or tetramethylammonium hydroxide (TMAH), or a combination thereof.

7. The method of claim 1, further comprising: introducing a basic solution to said oxidizing agent.

8. The method of claim 1, wherein said preparing step comprises lithographically forming a patterned photoresist layer.

9. The method of claim 1, wherein said HF treatment comprises exposing said masked substrate to a dilute HF solution (dHF), or a buffered HF solution (BHF).

10. The method of claim 1, wherein said removing step includes exposing said substrate to a mixture containing sulfuric acid and hydrogen peroxide.

11. The method of claim 1, further comprising: following said removing said patterned mask layer, performing a cleaning process.

12. The method of claim 11, wherein said cleaning process comprises exposing said substrate to an aqueous solution comprising ammonium hydroxide and hydrogen peroxide.

13. The method of claim 1, wherein said performing said HF treatment, said modifying said surface property, and said removing said patterned mask layer are performed sequentially in a wet chemical processing system.

14. The method of claim 1, wherein said removing step includes exposing said substrate to a mixture containing sulfuric acid and hydrogen peroxide in the presence of water vapor.

15. The method of claim 14, wherein said mixture containing sulfuric acid and hydrogen peroxide is dispensed from a first array of injection openings located above said substrate, and said water vapor is dispensed from a second array of openings.

16. The method of claim 15, wherein said first array of openings and said second array of openings are oriented relative to one another to allow said mixture of sulfuric acid and hydrogen peroxide and said water vapor to mix in a space above said substrate.

17. The method of claim 15, wherein said first array of openings and said second array of openings are distributed radially along a spray aim that extends above said substrate from approximately a central region of said substrate to approximately a peripheral region of said substrate.

18. The method of claim 17, wherein said substrate is rotated while dispensing said mixture of sulfuric acid and hydrogen peroxide and said water vapor.

19. The method of claim 1, further comprising:
   thermally growing said oxide layer to a first gate oxide thickness for a first gate structure in a multi-gate device; and performing said HF treatment to reduce the thickness of said oxide layer on at least a portion of said substrate to a second gate oxide thickness for a second gate structure in said multi-gate device.

20. The method of claim 1, wherein the oxidizing agent is administered in a composition comprising $NH_4OH/H_2O_2/H_2O$ in a ratio of about 1:50:200 by volume.

* * * * *